US007248705B1

(12) United States Patent
Mishan

(10) Patent No.: US 7,248,705 B1
(45) Date of Patent: Jul. 24, 2007

(54) NOISE REDUCING HEADPHONES WITH SOUND CONDITIONING

(75) Inventor: Steven Mishan, New York, NY (US)

(73) Assignee: Van Hauser LLC, New York, NY (US)

( * ) Notice: Subject to any disclaimer, the term of this patent is extended or adjusted under 35 U.S.C. 154(b) by 0 days.

(21) Appl. No.: 11/322,566

(22) Filed: Dec. 29, 2005

(51) Int. Cl.
*H03B 29/00* (2006.01)

(52) U.S. Cl. ........................................ 381/71.6; 381/74

(58) Field of Classification Search .................. 381/74, 381/71.1–71.14, 93, 83, 77, 61, 72; 700/94
See application file for complete search history.

(56) References Cited

U.S. PATENT DOCUMENTS

| | | | |
|---|---|---|---|
| 4,494,074 A | 1/1985 | Bose | |
| 4,644,581 A | 2/1987 | Sapiejewski | |
| 4,654,871 A * | 3/1987 | Chaplin et al. | 381/72 |
| 4,922,542 A | 5/1990 | Sapiejewski | |
| 5,181,252 A | 1/1993 | Sapiejewski et al. | |
| 5,867,580 A | 2/1999 | Anderson et al. | |
| 6,014,345 A | 1/2000 | Schmadeka | |
| 6,359,549 B1 * | 3/2002 | Lau et al. | 340/384.71 |
| 6,567,525 B1 | 5/2003 | Sapiejewski | |
| 6,897,781 B2 * | 5/2005 | Cooper et al. | 340/573.1 |
| 6,961,286 B1 | 11/2005 | Alagia | |
| 6,993,140 B1 | 1/2006 | Chen | |
| 7,039,207 B1 * | 5/2006 | Elrod et al. | 381/301 |
| 2005/0008167 A1 * | 1/2005 | Gleissner et al. | 381/74 |

* cited by examiner

*Primary Examiner*—Vivian Chin
*Assistant Examiner*—Corey Chau
(74) *Attorney, Agent, or Firm*—Notaro & Michalos PC

(57) ABSTRACT

A headphone set has a pair of headphone assemblies for engagement over the ears, each with a cushion and an active noise reduction circuit for reducing noise. A sound conditioning circuit stores various conditioning sounds for the user and an external sound source amplifier in the set is for connection to an external source of sound for supplying sound from the external source to the user. A power supply powers the set and switches are provided for selecting between modes of operation for supplying no sound to the user with no active noise reduction, for supplying no sound to the user with active noise reduction, for supplying the at least one conditioning sound to the user and for supplying sound from the external sound source to the user.

2 Claims, 3 Drawing Sheets

NOISE REDUCING HEADPHONES WITH SOUND CONDITIONING

FIELD AND BACKGROUND OF THE INVENTION

The present invention relates generally to the field of headphones, and in particular to, to a new and useful headphone arrangement for listing to externally generated sound such a prerecorded or broadcast music from an external device such as an MP3 player or radio, or for listening to a variety of pleasant or soothing sounds such as rainfall, which are stored in the arrangement, and for actively reducing outside noise, with or without the external or soothing sounds.

Sound conditioners are know which camouflage undesirable noise by generating pleasant sounds such as white noise, or natural sounds like ocean sound, summer night sounds, rain or rain forest sounds, waterfall sounds, a heartbeat, or other sounds that are selected to sooth the listener, for example, during bed timer to induce sleep. These devices are stand-alone units that are either battery powered or powered by wall current, and usually sit on a night stand or the like, for use during bed time, or to help calm an infant or child.

Know, non-active mechanisms for noise reduction are ear plugs and ear covers, for example, earmuffs that have noise blocking and absorbing qualities. Earmuffs generally include a resilient band that presses the arrangement against the sides of the users head to physically stop the noise from reaching the ear canal of the user.

Active noise cancellation techniques are also know which use a microphone on a headset for receiving the noise, and circuitry for generating a like signal but with opposing phase. This opposing-phase signal is then supplied to a speaker in the headset and serves to cancel at least some of the noise by the destructive interference. Other active noise reduction, attenuation or abatement techniques are also know.

U.S. Pat. No. 4,494,074 to Bose discloses headphones have a small cavity between a diaphragm and the ear canal with a microphone in the cavity and a feedback signal that is combined with an input electrical signal to be reproduced by the headphones to provide a combined signal that is power amplified for driving the diaphragm and reduces outside noise.

U.S. Pat. No. 4,644,581 to Sapiejewski discloses a headphone apparatus which includes a microphone that is off set from a central axis of the headphone cushion, but which extends parallel to this axis for improving the noise reduction capacity of the device.

U.S. Pat. No. 4,922,542 to Sapiejewski discloses a headphone apparatus which includes a driver having a vibratile diaphragm. This diaphragm separates a front cavity from a rear cavity, and a layer of foam bounds the front cavity. The apparatus includes a baffle which supports the driver, a headphone cup and a cushion large enough to encompass the outer ear of a user of the headphone and to form a seal with the front cavity.

U.S. Pat. No. 5,181,252 to Sapiejewski et al. discloses a headset with an ear cup having a front cavity and a rear cavity with a baffle separating the cavities from each other. A high compliance driver has a driver compliance that is greater than the rear cavity compliance. An active noise reducing circuitry is coupled to the driver.

U.S. Pat. No. 6,567,525 to Sapiejewski discloses a supra aural active noise reduction headphones including an ear-phone with an acoustical driver mounted within the internal cavity to reproduce sound for the user when driven by an audio signal. A cushion of these headphones has a passageway extending therethrough which acoustically connects the internal cavity to a user's ear canal when the cushion is resting on the user's ear while being worn by the user. The internal cavity has a total volume that is larger than about 10 cubic centimeters, and the driver is mounted in such a way as to avoid obstructing the passageway.

A need remains for a headphone arrangement which provides a used with an improved listening or even, silent experience over those available in the prior art.

SUMMARY OF THE INVENTION

It is an object of the present invention to provide a headphone set comprising: a pair of headphone assemblies each for engagement over one ear of a user, each headphone assembly having means for passively excluding sound from reaching the user; an active noise reduction circuit mounted in at least one of the headphone assemblies for actively reducing noise generated outside the headphone set from reaching the user; a sound conditioning circuit mounted in at least one of the headphone assemblies for storing at least one conditioning sound for being supplied to the user; an external sound source amplifier mounted in at least one of the headphone assemblies for connection to an external source of sound for supplying sound from the external source of sound to the user; a power supply for powering each of the active noise reduction circuit, the sound conditioning circuit, and the external sound source amplifier; and switching means for selecting between a first mode of operation for supplying no sound to the user with no active noise reduction, a second mode of operation for supplying no sound to the user with active noise reduction; a third mode of operation for supplying the at least one conditioning sound to the user and a fourth mode of operation for supplying sound from the external sound source to the user.

It is a further object of the invention to provide such a headphone set which includes a head band connected between the headphone assemblies for holding the headphone assemblies over the ears of the user although other means for holding the headphone assemblies over the ears can also be used, such as a clip connected to each assembly for engaging around the back of each ear.

It is a further object of the invention to provide such a headphone set wherein the means for passively excluding sound from reaching the user comprise a cushion connected to each headphone assembly for pressing against the user and over the ears of the user.

It is a further object of the invention to provide such a headphone set wherein the active noise reduction circuit included means for sensing noise that is outside the headphone set, generating a compensating sound to the noise and supplying the compensating sound to the user for canceling at least some of the noise.

It is a still further object of the invention to provide such a headphone set which includes the sound conditioning circuit having means for storing a plurality of conditioning sound for being supplied to the user, such as, but not limited to, summer night sounds, brook sounds, rain sounds, white noise, tropical sounds and water fall sounds.

It is a further object of the invention to provide such a headphone set where the switching means comprising an on-off switch for powering the active noise reduction circuit, the sound conditioning circuit and the external sound source amplifier for the second mode of operation, a push button switch for selected each of the conditioning sounds in sequence for the third mode of operation and a mode with no conditioning sound, a roll switch for selecting a volume for the conditioning sounds and for sound from the external sound source, and a jack switch for selecting the fourth mode when an external sound source is connected to the external sound source amplifier by a jack engaged to the jack switch.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENTS

Figure 1:
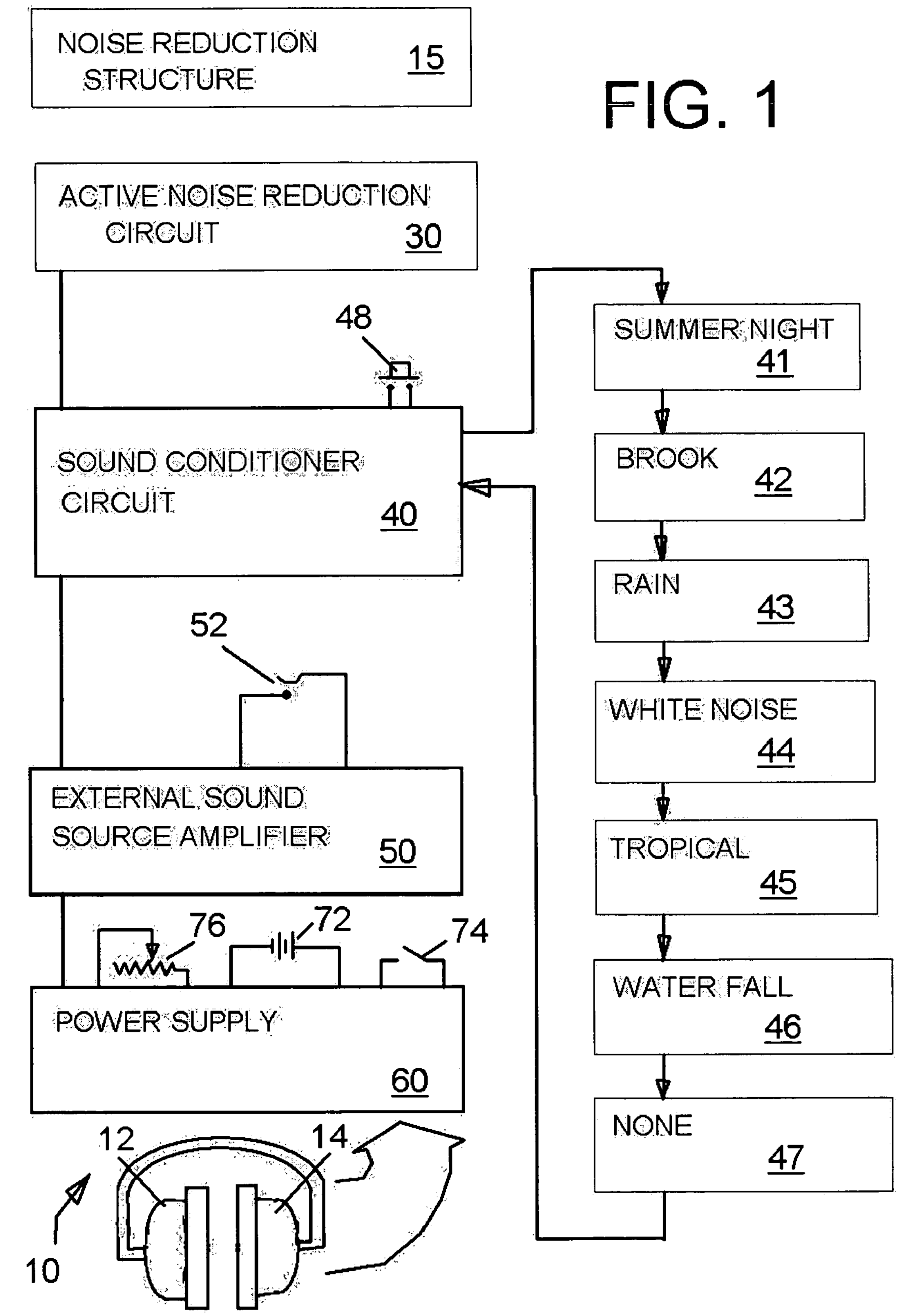
FIG. 1 is a function block diagram of the headphone set of the present invention.
Figure 3:
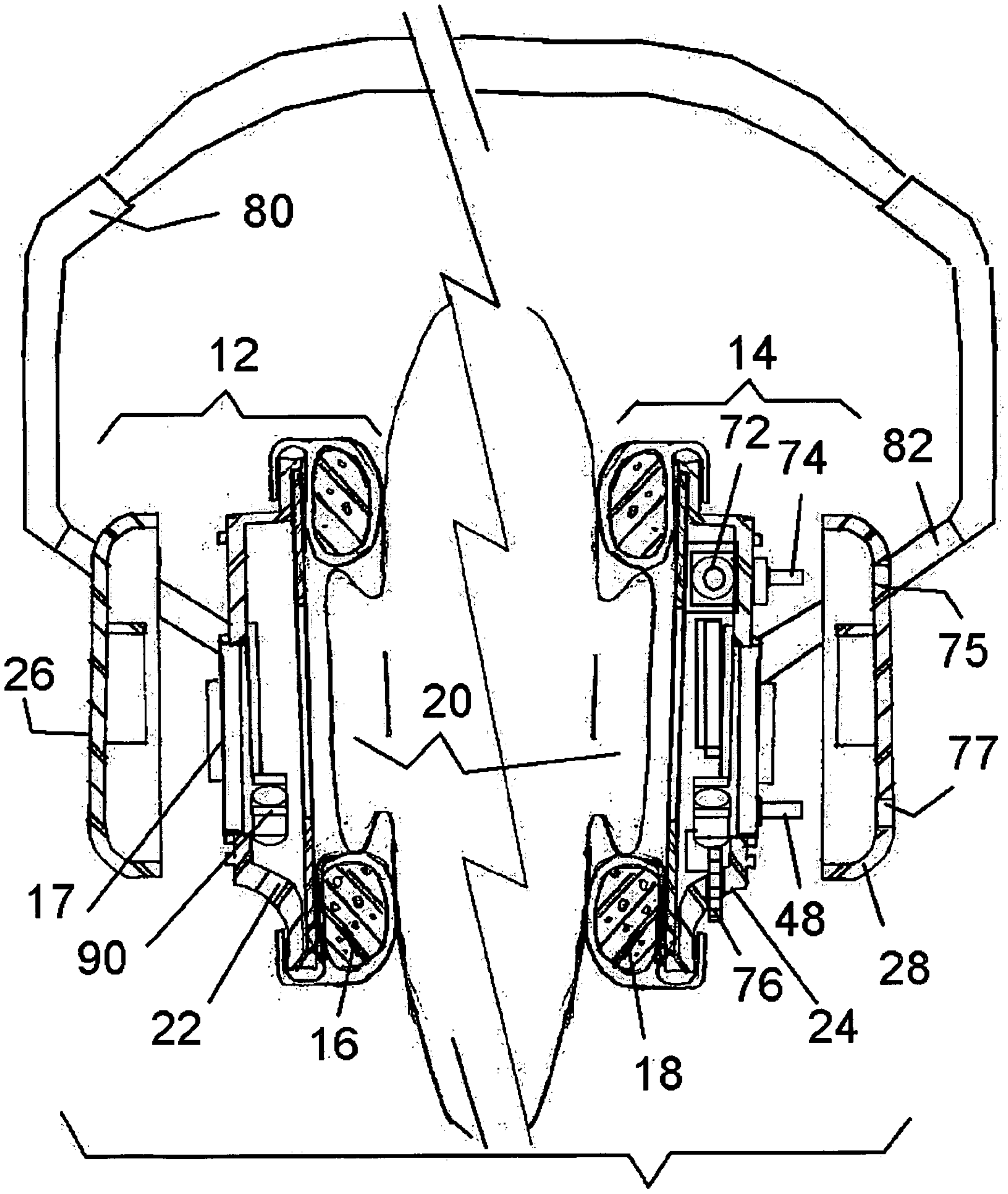
FIG. 3 is a partly exploded and fragmentary front sectional view of the headphone set of the present invention

Referring to the drawings where like reference numerals are used to refer to the same or similar elements, FIG. 1 shows a headphone set 10 comprising a pair of headphone assemblies 12 and 14 each for engagement over one ear 20 of a user as shown in FIG. 3. Each headphone assembly 12, 14 has means 15 in FIG. 1, for passively reducing outside sound from reaching the user, such as a pair of ear-surrounding cushions 16 and 18 and a further noise reduction structure in the form of, for example, a shell 22 and 24 for each assembly. Each shell has an inner side to which the cushions are engaged and an outer side covered by a respective cap 26 and 28 in FIG. 3.

An active noise reduction circuit 30 in FIG. 1 is mounted in at least one of the headphone assemblies 12, 14, for actively reducing noise generated outside the headphone set from reaching the user. Currently known or subsequently discovered circuits and means for such active noise reduction can be used, as would be known to those skilled in this art.

According to the invention, a sound conditioning circuit 40 is also mounted in at least one of the headphone assemblies 12, 14, for storing at least one, but preferably a plurality of conditioning sounds for being supplied to the user. Currently known or subsequently discovered circuits and means for generating such sounds can be used, as would be known to those skilled in this art. Examples include, but are not limited to, summer night sounds 41 (e.g. with various random insect sounds), brook sounds 42 (e.g. the sounds of water running over stones and pebbles in a stream), rain sounds 43 (e.g. including distant thunder), white noise 44 (e.g. statistically random sound), tropical, e.g. rain forest sound 45, and/or water fall sounds 46.

As will be explained more fully later in this disclosure, the user can sequentially scroll through these sounds by repeatedly pressing a push button switch 48. The sequence includes, in the preferred embodiment of the invention, a no conditioning or silent step 47 so that the active noise reduction mode with no conditioning sound can be selected using the same button 48.

Figure 2:
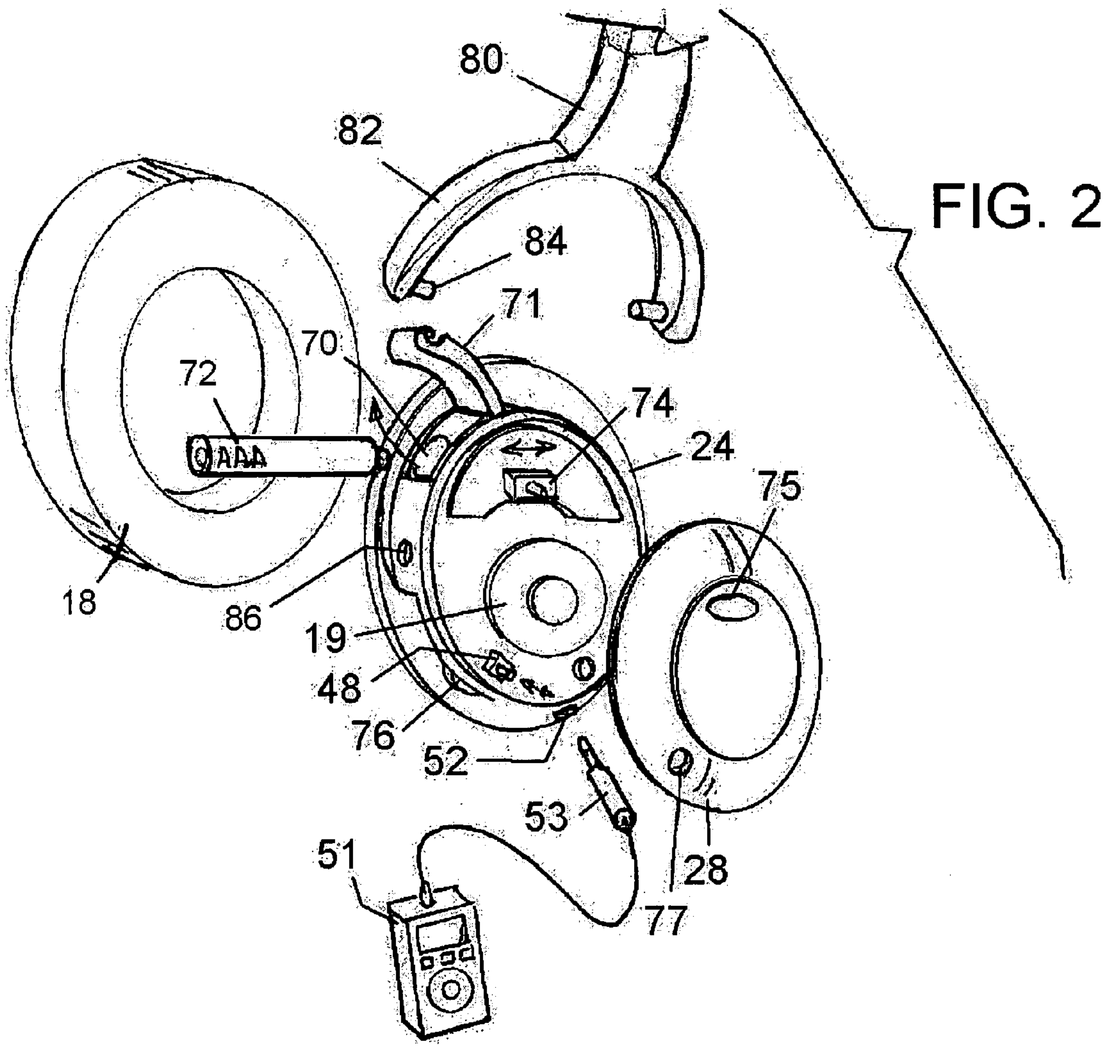
FIG. 2 is a fragmentary and exploded view of one headphone assembly of the headphone set of the invention.

An external sound source amplifier 50 is also mounted in at least one of the headphone assemblies 12, 14, for connection to an external source of sound, e.g. via a female jack with jack switch 52, for supplying sound from the external source of sound to the user, such as an MP3 player 51 in FIG. 2, a CD player, a radio, or other source of electronically or electrically created sound. The jack switch 52 is of a know structure that disconnected the sound conditioner circuit 40 from supplying sound to speakers 17 and 19 of the headphone assemblies 12, 14, when a male jack 53 of the external sound source 51 is plugged into jack switch 52, to avoid a confusion of sounds. In a known manner, however, the active sound reduction circuit is still active in this mode of operation.

Currently known or subsequently discovered external sound source circuits can be used, as would be known to those skilled in this art.

A power supply 60 for powering each of the active noise reduction circuit 30, the sound conditioning circuit 40, and the external sound source amplifier 50 is also provided in at least one of the headphone assemblies 12, 14. The power supply can be a battery compartment 70 in FIG. 2, for a battery 72, or other power supply, e.g. a power jack for connection to a wall powered transformer.

Appropriate switching means are also provided for selecting between a first mode of operation for supplying no sound to the user with no active noise reduction, e.g. a power or on-off switch 74 that is open for allowing no power to the circuits, a second mode of operation for supplying no sound to the user with active noise reduction (e.g. the button switch 48 after the power switch 74 has been closed for activating the circuits), a third mode of operation for supplying the at least one conditioning sound to the user (e.g. the button switch 48 for sequencing through sounds 41-46), and a fourth mode of operation for supplying sound from the external sound source to the user (e.g. the jack switch 52.

The switching means also includes a roll switch 76 for selecting a volume for the conditioning sounds and for sound from the external sound source if connected via the jack and jack switch 53, 52, for selecting the fourth mode of operation when an external sound source is connected to the external sound source amplifier.

A shown in FIGS. 2 and 3, the headphone set 10, includes a head-surrounding band 80 with a cushioned central part for resting on the top of the user's head, and a pair of hoops 82, each with a pair of inwardly extending projections 84 that engage apertures 86 on the opposite side of each of the head phone assembly housing 22 and 24, for gently pressing the cushions 16, 17 against the sides of the head of the user and around each of the user's ears 20. Other means for holding the headphone assemblies to the user's ears can alternatively by used as would be know or later discovered by those skilled in the art.

As best shown in FIG. 2, battery compartment 70 includes a door 71 which can be opened to receive the battery 72 in the direction of the arrow pointing to the right. The horizontal double arrow in FIG. 2 indicates the back and forth movement of on-off switch 74 in the form of a slide switch which has a finger engaging projection that extends out through a first side opening 75 in the cap 28. Push button switch 48 also has a finger engaging projection which extends through a second side opening 77 in cap 28 so that it can be sequentially pushed by a user in the direction of the double arrow next to switch 48. Roll switch 76 is provided in an edge slot at the perimeter of housing 24.

As best shown in FIG. 3, the active noise reduction circuit includes a microphone 90 which faces across the front of each of the speakers 17 and 19 and is included in the active noise reduction circuit in a known manner for picking up external sounds and generating an inverse signal to those sounds which is supplied within the other signal that is used to drive the speakers 17 and 19, thereby effectively eliminating, canceling or drastically reducing the external sound. Such active reduction in conjunction with the passive noise reduction effected by the structure of the head phone assemblies and, in particular, the cushions 16 and 18, little or no outside noise reaches the user's ears.

All of the circuits and the power supply are preferably mounted to the shell 24 with a wire extending through the aperture 86, along one side of the hoop 82, along an inside channel of the band 80, along the other hoop and aperture 86 and to the speaker and microphone of the other shell 22 to supply sounds and active noise reduction to both ears of the user.

While a specific embodiment of the invention has been shown and described in detail to illustrate the application of the principles of the invention, it will be understood that the invention may be embodied otherwise without departing from such principles.

What is claimed is:

1. A battery operated headphone set comprising:

a pair of headphone assemblies each for engagement over one ear of a user, each headphone assembly having means for passively excluding sound from reaching the user in the form of a cushion connected to each headphone assembly for pressing against the user and over the ears of the user;

an active noise reduction circuit mounted in at least one of the headphone assemblies for actively reducing noise generated outside the headphone set from reaching the user, the active noise reduction circuit including means for sensing noise that is outside the headphone set, generating a compensating sound to the noise and supplying the compensating sound to the user for canceling at least some of the noise;

a sound conditioning circuit mounted in at least one of the headphone assemblies for storing a plurality of different prerecorded repetitious conditioning sounds for being supplied to the user, the sound conditioning circuit including means for storing a plurality of different prerecorded repetitious conditioning sounds for being supplied to the user one at a time;

an external sound source amplifier mounted in at least one of the headphone assemblies for connection to an external source of sound for supplying sound from the external source of sound to the user;

a battery powered power supply for powering each of the active noise reduction circuit, the sound conditioning circuit, and the external sound source amplifier;

switching means for selecting between a first mode of operation for supplying no sound to the user with no active noise reduction, a second mode of operation for supplying no sound to the user with active noise reduction; a third mode of operation for supplying one conditioning sound to the user with active noise reduction and a fourth mode of operation for supplying sound from the external sound source to the user with active noise reduction; and a band connected between the headphone assemblies for holding the headphone assemblies over the ears of the user;

wherein each headphone assembly includes a housing, the switching means comprising an on-off switch that is accessible via a first side opening in said housing, for powering the active noise reduction circuit, the sound conditioning circuit and the external sound source amplifier, a push button switch that is accessible via a second side opening in said housing, for selected each of the conditioning sounds in sequence for the third mode of operation and a mode with no conditioning sound, a roll switch that is accessible via an edge slot in said housing, for selecting a volume for the conditioning sounds and for sound from the external sound source, and a jack switch in said housing for selecting the fourth mode when an external sound source is connected to the external sound source amplifier by a jack engaged to the jack switch.

2. The headphone set according to claim 1, wherein the plurality of conditioning sounds for being supplied to the user is selected from the group comprising; summer night sounds, brook sounds, rain sounds, white noise, tropical sounds and water fall sounds.

* * * * *